United States Patent [19]

Williams

[11] 4,278,704

[45] Jul. 14, 1981

[54] METHOD FOR FORMING AN ELECTRICAL CONTACT TO A SOLAR CELL

[75] Inventor: Brown F. Williams, Princeton, N.J.

[73] Assignee: RCA Corporation, New York, N.Y.

[21] Appl. No.: 116,790

[22] Filed: Jan. 30, 1980

[51] Int. Cl.³ .......................... B05D 3/02; B05D 3/10
[52] U.S. Cl. ...................................... 427/75; 427/74; 427/91; 427/93
[58] Field of Search ........................ 427/74, 75, 91, 93

[56] References Cited

U.S. PATENT DOCUMENTS

| 3,801,365 | 4/1974 | Hrzek | 427/91 |
| 3,811,954 | 5/1974 | Lindmayer | 136/89 |
| 3,949,463 | 4/1976 | Lindmayer et al. | 427/75 X |
| 4,090,213 | 5/1978 | Maserjian et al. | 357/30 |
| 4,105,471 | 8/1978 | Yerkes et al. | 427/75 X |
| 4,165,241 | 8/1979 | Yerkes et al. | 427/75 X |

OTHER PUBLICATIONS

Rittner, "Recent Advances in Silicon Solar Cells for Space Use," undated.
Lindmayer et al., "The Violet Cell: An Improved Silicon Solar Cell," Comsat Technical Review, vol. 3, No. 1, spring 1973, pp. 1–21.
Pryor et al., "Metallization of Large Silicon Wafers," Quarterly Technical Report No. 3, (Apr. 1, 1978–Jun. 30, 1978), pp. 28–31.

Primary Examiner—James R. Hoffman
Attorney, Agent, or Firm—Birgit E. Morris; Donald S. Cohen; Sanford J. Asman

[57] ABSTRACT

A method of forming an electrical contact to a shallow junction silicon semiconductor device such as a solar cell comprises evaporating a sufficient amount of a metal which upon heating will form a silicide with the silicon to a predetermined depth and thereafter oxidizing the surface of the silicon so as to form a shallower junction in the unoxidized portions of said silicon. The portion of the silicon device which has formed the silicide does not oxidize and forms an electrical contact to the silicon. In addition, the metal silicide can have additional metal plated thereto to lower the sheet resistivity and resistance of the electrical contact.

16 Claims, 4 Drawing Figures

METHOD FOR FORMING AN ELECTRICAL CONTACT TO A SOLAR CELL

This invention relates to electrical contacts for semiconductor devices. More specifically, this invention relates to a method of forming an electrical contact to a silicon semiconductor device having a shallow junction rectifying barrier contained therein.

BACKGROUND OF THE INVENTION

It is known that the efficiency of solar cells can be improved by the elimination of the dead layer at the surface of the solar cell. Eliminating the dead layer improves the response of the solar cell to light in the blue and violet portions of the solar spectrum. The performance of the solar cell in this, i.e., the blue and violet portion of the solar spectrum, is enhanced by providing a junction depth which is on the order of 1000 to 1500 angstroms below the top surface of the silicon semiconductor material. The actual depth of the junction below the top surface of the solar cell varies and will be a function of the thickness of the electrical contact grid and antireflection coating applied on the surface of the silicon.

The shallow junction solar cell, or violet cell as it has been named, exhibits increased performance in the blue and violet regions of the solar spectrum in which the greatest power output of photons from solar radiation are concentrated. However, the violet cell with its shallow junction presents problems during the formation of the surface grid electrode or electrical contact to prevent the electrode from punching through the shallow junction. Methods have been developed for forming a fine finger geometry on a solar cell having a shallow junction. However, the method of forming the contact pattern often requires extensive steps of diffusion, oxidation, photolithography, metallization, and plating. The numerous processing steps, especially photolithography, greatly adds to cost of the solar cell and slows the rate of processing and fabrication of the solar cell.

Thus, it would be highly desirable to have a process of forming an electrical contact to a shallow junction solar cell without punching through the junction.

SUMMARY OF THE INVENTION

A method of forming an electrical contact to the thin surface region of one type of conductivity of a shallow junction semiconductor device such as a solar cell comprises depositing a sufficient amount of a metal which upon heating forms a silicide with the surface region to a predetermined depth in the surface region, and thereafter oxidizing the surface region of the solar cell not containing the metal silicide to a sufficient thickness to form an antireflection coating and remove the surface damage formed there during the doping process of said region to effectively form a shallower junction in said device.

DETAILED DESCRIPTION OF THE INVENTION

Figure 1A:
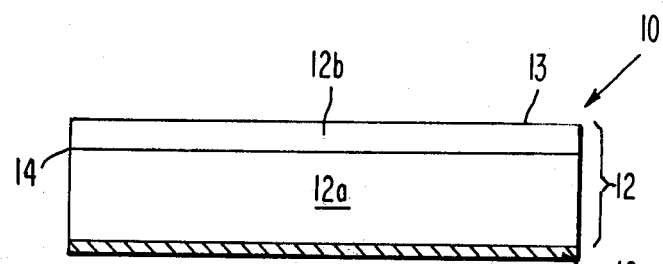
FIGS. 1(a-d) illustrate the method of the invention.

Fabricating a solar cell having a shallow junction contained therein requires very careful control of temperatures and doping times. The use of my invention permits the formation of a solar cell having a junction depth which is comparable to that of a violet cell but permits the fabrication of the solar cell under standard procedures.

FIGS. 1(a-d) illustrate the basic steps of my method of forming a contact to the surface region of a semiconductor device. The semiconductor device 10, such as a solar cell is illustrated in FIG. 1(a). Device 10 has a body 12 of silicon with a surface 13 wherein said body has a main region of one conductivity type 12a and a second region 12b of opposite conductivity formed in region 12a at a surface 13 thereof. The change in conductivity type from region 12b to region 12a forms a junction 14 such as a PN junction. Device 10 further incorporates an electrical contact 16 of any suitable material such as a gold, silver, platinum, or a titanium-silver alloy and the like to region 12(a) of the body 12.

Figure 1B:
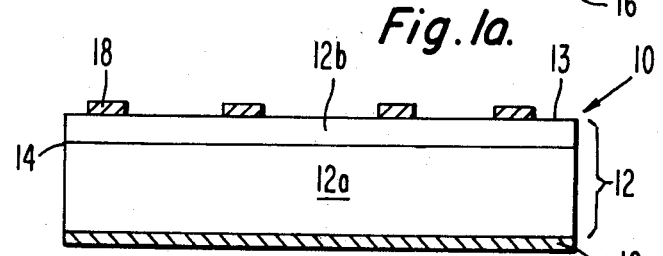
Figure 1C:
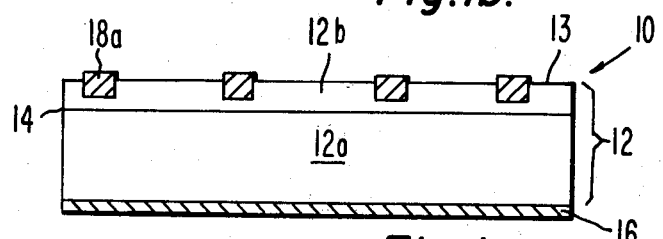
Figure 1D:
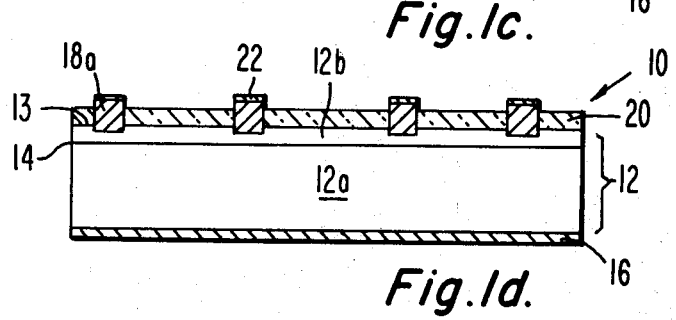

A layer or grid pattern 18 of a metal which forms a silicide with the silicon body 12 is deposited thereon as illustrated in FIG. 1(b). Thereafter, FIG. 1(c), the device 10 is heated to a sufficient temperature and for a sufficient time to form the metal silicide electrical contact 18(a) and drive the silicide into region 12(b). Control of the amount of metal 18 or the time and temperature of heating determines the depth of penetration of the metal silicide 18(a) into region 12(b). Finally, as illustrated in FIG. 1(d), the surface region 12(b) is heated to oxidize same, remove the surface defects from the formation of region 12(b) and make region 12(b) thinner and the junction 14 shallower. The oxidizing is continued until the desired junction depth 14 is achieved from the surface 13 of the body 12. Optionally, a metal 22 can be fabricated by methods known in the art on the metal silicide electrical contacts 18(a).

For example, a standard solar cell having a junction depth of twice the final desired depth, or about 2000 angstroms, is fabricated by methods known in the art. The solar cell has a body of one conductivity type, such as a P-type body with a dopant concentration of from about $1 \times 10^{15}$ to about $1 \times 10^{16}$ P-type dopant atoms per cubic centimeter and a shallow N-type region about 2000 angstroms thick at the surface of said body. The N-type region incorporates suitable N-type dopants such as phosphorus in a concentration of from about $5 \times 10^{19}$ to about $5 \times 10^{20}$ dopant atoms per cubic centimeter. The shallow N-type region is incident to solar radiation. The thickness of the N-type region forms a rectifying junction at about 2000 angstroms below the incident surface of the solar cell. Although an NP type structure has been described, the method will also work for a PN or P+N, and like structures.

A metal such as palladium which forms a silicide with silicon is evaporated on to the incident surface of the solar cell in an amount which is sufficient to form a silicide which will penetrate about 1000 angstroms into the surface of the N-type region. About 600 angstroms of palladium should be sufficient to form a final silicide having a depth of about 1000 angstroms. The palladium is deposited by electron beam evaporation on to the surface or by other methods known in the art such as sputtering. The palladium is deposited by printing or sputtering on to the surface of the silicon in the form of any grid or contact pattern which is desired to make the electrical contact the incident region.

Thereafter, the palladium coated solar cell is heated to a temperature of from about 250° to about 380° C. for a sufficient time to form palladium silicide having a penetration into the N-type region of about 1000 angstroms. For example, at 350° C. about 30 seconds will be needed to form the silicide while at 300° C. about 4 minutes will be needed to form a silicide. The time-temperature relationship formation of the silicide can be obtained by referring to pages 29 and 30 of The Metallization Of Large Silicon Wafers, Quarterly Technical Report Number 3, Apr. 1, 1978 June 30, 1978 DOE/JPL Contract 954689-78/3.

Alternatively, excess palladium can be evaporated or deposited onto the surface of the N-type region and subsequently heated to form a silicide of the desired thickness if the time temperature relationships discussed in the previously mentioned contact are followed. The contact is incorporated by reference herein. For example, if a thousand angstroms of palladium were evaporated on to the surface, the same temperature as previously recited would be necessary to form about a thousand angstroms of silicide; however, not all of the palladium would be used up during the formation of the silicide.

Thereafter, the solar cell is heated in contact with steam to form an oxide over those portions of the surface of the solar cell not containing the palladium silicide. There is about a two for one relationship between the thickness of the oxide and the amount of silicon removed to form said oxide. With a solar cell having a junction depth of about 2000 angstroms, it would be desirable to form an oxide having a thickness of about 2000 angstroms. This would remove about 1000 angstroms of silicon, forming a solar cell having a junction depth about 1000 angstroms below the oxide. For example, subjecting the solar cell to steam at a temperature of about 800° C. for about 3 hours should be sufficient to grow a 2000 angstrom thick oxide layer and remove about 1000 angstroms of silicon from the surface of the solar cell, effectively making the junction depth about one half the original junction depth, or about 1000 angstroms. The oxidation provides additional benefits in that it can be controlled so as to provide a multiple quarter wave pattern for a suitable antireflection coating and/or be used to remove the surface damage formed in the silicon during the doping of the surface region of the P-type body to an N-type conductivity.

Optionally, to further reduce the series resistance of the palladium silicide contact, a suitable metal such as palladium, gold, or a titanium/silver combination can be metallized onto the palladium silicide by techniques such as silk screening, electroless plating, evaporation through a mask or other methods known in the art. The conditions can be controlled so that the plating preferentially forms on the silicide and not the silicon oxide formed on the surface of the solar cell.

The method permits the fabrication of violet type solar cells without punching through the thin surface region of the solar cell. In addition, the depth of the initial junction of the solar cell need not be one-half the final depth and in fact can be deeper or shallower depending upon the desired depth of the final junction as well as the thickness of the desired $SiO_2$ layer formed on the surface of the solar cell. Furthermore, the invention is not limited solely to palladium. Other metals which will form silicides are known in the art such as platinum and the like, and are considered to be within the scope of the invention.

It should be understood that the invention is not meant to be limited solely to the details described herein. Modifications which would be obvious to one of ordinary skill in the semiconductor art are contemplated to be within the scope of the invention.

What is claimed is:

1. A method of forming an electrical contact to the surface region of a silicon semiconductor device without punching through said region, said device having a body of one conductivity type with opposed major surfaces and a region in said body at one of said major surfaces of opposite conductivity type to said body forming a rectifying junction in said body between said region and said body and means for electrically contacting the major surface opposite to said region, comprising:

depositing a sufficient amount of a metal onto said region wherein said metal upon heating will form a silicide with said region to a predetermined depth of penetration into said region;

heating said device to a sufficient temperature and for a sufficient time to form said metal silicide to the predetermined depth in said region; and oxidizing the surface of said region not containing said silicide.

2. The method according to claim 1 which wherein said device has an initial junction depth greater than the final junction depth.

3. The method according to claim 2 wherein the initial junction depth is twice the depth of the final junction depth.

4. The method according to claim 1 wherein the metal is selected from the group consisting of palladium and platinum.

5. The method according to claim 4 wherein the palladium is evaporated in an amount which is sufficient to completely react with the silicon in said region so as to form a contact having the desired depth but without punching through said surface region of said device.

6. The method according to claim 5 wherein palladium is evaporated onto the surface of said device in an amount in excess of that which is necessary to form a contact having a predetermined depth in the surface region and the heating is controlled such that the silicide does not punch through said region.

7. The method according to claim 1 wherein the oxidation is sufficient to decrease the distance of said junction from the surface of said device.

8. The method according to claim 7 wherein the oxidation is to a sufficient depth to form an antireflection coating on said device.

9. The method according to claim 7 or 1 further incorporating the metallization of the metal silicide portions of said device.

10. The method according to claim 9 wherein the metal is selected from the group consisting of gold, platinum, palladium, and a titanium/silver alloy.

11. The method according to claim 10 wherein said device is a silicon solar cell.

12. In a method of fabricating a silicon solar cell having a body of one conductivity type and a surface region of opposite conductivity type wherein the rectifying junction formed therebetween is from about 1500 to about 4000 angstroms below the surface of said region of opposite conductivity type, said solar cell further incorporating means for electrically contacting the surface of said solar cell opposed to the surface region of opposite conductivity type to said body, the improvement which comprises:

depositing a sufficient amount of metal onto the surface region of said solar cell wherein said metal is capable of forming a silicide to a predetermined depth in said surface region upon heating;

heating the solar cell for a sufficient time and at a sufficient temperature to form the silicide; and
oxiding the surface of said solar cell.

13. The method according to claim 12 wherein the depth of the oxide is equivalent to the depth of penetration of the silicide into the surface of the solar cell.

14. The method according to claim 12 wherein the surface of said solar cell having said metal silicide in said surface region is oxidized so as to form a solar cell having a rectifying junction at a depth of from about 500 to about 1500 angstroms below the surface of the silicon region of opposite conductivity to said body.

15. The method according to claim 14 wherein the metal is selected from the group consisting of palladium and platinum.

16. The method according to claim 15 further incorporating metallizing the portions of the solar cell incorporating said silicide.

* * * * *